United States Patent [19]
Okonogi et al.

[11] Patent Number: 5,112,648
[45] Date of Patent: May 12, 1992

[54] METHOD OF MANUFACTURING A PRINTED CIRCUIT BOARD

[75] Inventors: Hirotaka Okonogi; Katsutomo Nikaido; Junichi Ichikawa; Yoshio Nishiyama, all of Saitama, Japan

[73] Assignee: Nippon CMK Corp., Japan

[21] Appl. No.: 682,921

[22] Filed: Apr. 9, 1991

[30] Foreign Application Priority Data

Jul. 18, 1990 [JP] Japan .................................. 2-190157

[51] Int. Cl.⁵ .............................................. B05D 5/12
[52] U.S. Cl. ........................................ 427/96; 29/620; 174/35 R; 174/255; 174/259
[58] Field of Search .................. 427/96; 29/600, 601, 29/620; 174/35 R, 255, 259

[56] References Cited

U.S. PATENT DOCUMENTS 4,801,489  1/1989  Nakasawa et al. ................... 174/264
5,030,800  7/1991  Kawakami et al. .............. 174/35 R

FOREIGN PATENT DOCUMENTS 289299  11/1989  Japan ................................. 174/35 R Primary Examiner—P. W. Echols
Attorney, Agent, or Firm—Bruce L. Adams; Van C. Wilks

[57] ABSTRACT

A method of manufacturing a printed circuit board is disclosed. The method comprises steps of providing a substrate for the printed circuit board, forming circuit patterns on one or both sides of the substrate, and shielding the whole or a required part of the circuit patterns by using a shield layer in such a manner that the shield layer and a grounding circuit of the circuit patterns are connected through a resistor. This method of manufacturing a printed circuit board is improved so that adhesion between the shield layer and the junction land of the grounding circuit is enhanced by the joining of the shield layer to the junction land of the grounding circuit through the resistor, and that the noise preventive action of the shield layer is improved by the attenuating of electromagnetic-wave energy received by the shield layer which is to be discharged as electrical current to the grounding circuit. For example, such improvement is made by using a resistor having a resistance value higher than that of said shield layer and/or made of a conductive material mainly composed of carbon or copper or both.

3 Claims, 1 Drawing Sheet

METHOD OF MANUFACTURING A PRINTED CIRCUIT BOARD

BACKGROUND OF THE INVENTION

The present invention relates to a method of manufacturing a printed circuit board having circuit patterns shielded with a shield layer.

As an example of a method of manufacturing a printed circuit board, there is known a method of manufacturing a printed circuit board having a shield layer formed on an overlaid insulating layer in order to shield circuit patterns formed on one or two sides of a substrate of the board from electromagnetic noises coming from external instruments or other circuit patterns formed on the board in the same way.

FIG. 2 is an illustration showing such an example. In the figure, a circuit pattern (not shown) is formed by the conventional method on one side of an insulating substrate 1, an insulating layer 2 is adhered to the top surface of the circuit pattern except for a junction land 6, and then an electromagnetic-wave shielding layer 4 is adhered to the insulating layer placed on the top surface of the circuit pattern. The junction land 6 is used for connecting the electromagnetic-wave shielding layer 4 to a grounding circuit.

Conductive ink is adhered by the silk-screen printing method to the electromagnetic-wave shielding layer 4 so as to electrically connect the shielding layer to the junction land 6, which is connected to the grounding circuit. Furthermore, the shielding layer 4 is coated with an overcoat 5.

In a conventional method of adhering a shield layer to the junction land 6, conductive ink is adhered to the shield layer 4 in the process of adhering the shield layer to the junction land 6 connected to the grounding circuit. Prior to this process, to improve the adhesion of the shield layer to the junction land 6, either oxide film is formed on the copper film composing the junction land 6 by heat-treating the copper at a temperature between 140° and 150° C. for 30 to 40 minutes in an oven, or the surface of the junction land 6 is roughened by means of a special polishing method. But such conventional methods suffer from the drawbacks that they require extra labor and special treatments.

SUMMARY OF THE INVENTION

An object of the present invention is to eliminate the above disadvantage in the conventional method of manufacturing a printed circuit board.

Another object of the present invention is to provide a method for manufacturing a printed circuit board which secures a precise joining between the shield layer and the grounding circuit through simple treatments without increasing the number of processes or adding special treatments.

According to the present invention, there is provided a method of manufacturing a printed circuit board which comprises steps of providing a substrate for the printed circuit board, forming circuit patterns on one or both sides of the substrate, and shielding the whole or a part of the circuit patterns by using a shield layer in such a manner that the shield layer and a grounding circuit of the circuit patterns are connected through a resistor.

According to the above construction of the printed circuit board, it is possible and an advantage to enhance adhesion between the shield layer and the junction land of the grounding circuit by joining the shield layer to the junction land of the grounding circuit through the resistor, and also to improve the noise preventive action of the shield layer by attenuating electromagnetic-wave energy received by the shield layer which is to be discharged as electrical current to the grounding circuit.

In the above construction of the printed circuit board, another advantage is that the resistor can be formed at the same time that the contact is printed on printed circuit boards requiring carbon contacts used in instruments, such as telephones, pocket calculators, key boards, and remote controllers.

These objects and other objects, features, aspects, and advantages of the present invention will become more apparent from the following detailed description of the present invention when taken in conjunction with the accompanying drawings.

Detailed Explanation of the Preferred Embodiment

Figure 1:
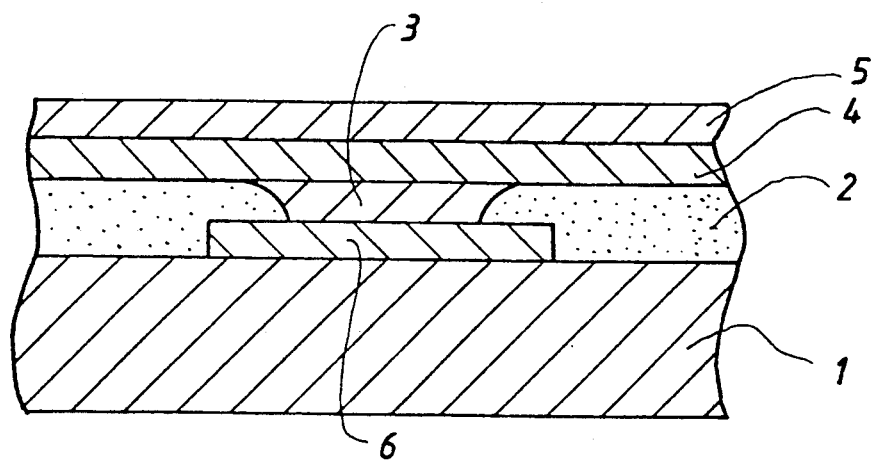
FIG. 1 is an illustration showing a method of manufacturing a printed circuit board of an embodiment of the present invention.
Figure 2:
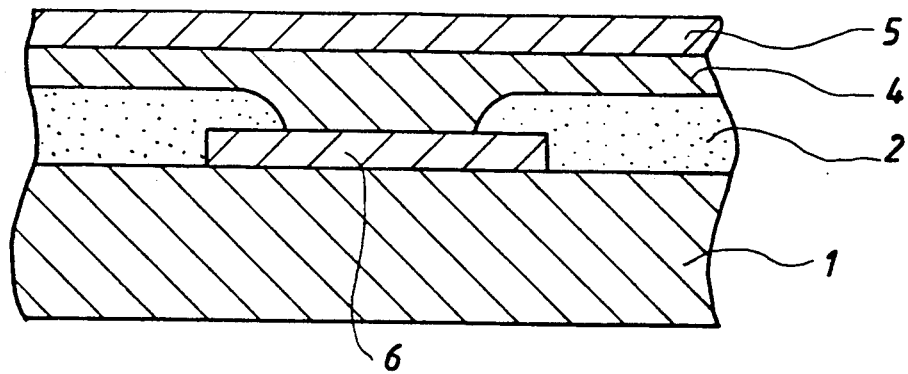
FIG. 2 is an illustration showing a conventional method of manufacturing a printed circuit board.

FIG. 1 is an illustration showing a method of manufacturing a printed circuit board of an embodiment of the present invention.

First, a printed circuit composed of a required circuit pattern (not shown) is formed on one side of a substrate 1 in accordance by a conventional method.

Next, an insulating layer 2 is formed by applying insulator ink to the whole surface of the substrate 1 or to a required part of the circuit pattern by means of silk-screen printing, and then hardening the insulating layer by a conventional hardening method.

In forming the above insulating layer 2, only the junction land 6 of the grounding circuit is left exposed without being covered with the insulating layer, because the land is to be connected to the shield layer.

Then, a resistor 3, which has good adhesion to the copper film composing the junction land 6 and shows a resistance higher than that of the shield layer, is adhered to the upper side of the junction land 6 by applying carbon ink or copper paste ink between the resistor and the junction land 6 by means of silk-screen printing or the like.

Then, the upper surface of the insulating layer 2 is coated with copper paste ink having a resistance lower than that of the resistor 3 by silk-screen printing or the like to form a shield layer 4, which is then coated with overcoat 5 to provide a printed circuit board of the embodiment of the present invention.

Some treatments such as Trademark printing may be applied to the overcoat 5, if required.

In addition to the above conditions, it is desirable to make the resistor 3 out of a material of a chemical composition providing sufficient adhesion both to the junction land 6 and to the shield layer 4.

Although the embodiment has been described and illustrated in the case of a one-sided printed circuit board, the invention can be applied equally to double-sided and other laminated printed circuit boards.

What is claimed is:

1. A method of manufacturing a printed circuit board, comprising steps of providing a substrate for said printed circuit board, forming circuit patterns on one or both sides of said substrate, and shielding the whole or a required part of said circuit patterns by using a shield layer in such a manner that said shield layer and a grounding circuit of said circuit patterns are connected through a resistor.

2. A method of manufacturing a printed circuit board as claimed in claim 1, wherein said resistor has a resistance value higher than that of said shield layer.

3. A method of manufacturing a printed circuit board as claimed in claim 1, wherein said resistor is made of a conductive material mainly composed of carbon or copper or both.

* * * * *